United States Patent
Zoellin et al.

(10) Patent No.: US 9,588,005 B2
(45) Date of Patent: Mar. 7, 2017

(54) COMPONENT PART AND METHOD FOR TESTING SUCH A COMPONENT PART

(71) Applicant: Robert Bosch GmbH, Stuttgart (DE)

(72) Inventors: Jochen Zoellin, Muellheim (DE); Ricardo Ehrenpfordt, Korntal-Muenchingen (DE); Juergen Graf, Stuttgart (DE); Christoph Schelling, Stuttgart (DE); Frederik Ante, Stuttgart (DE); Michael Curcic, Stuttgart (DE)

(73) Assignee: ROBERT BOSCH GMBH, Stuttgart (DE)

( * ) Notice: Subject to any disclaimer, the term of this patent is extended or adjusted under 35 U.S.C. 154(b) by 430 days.

(21) Appl. No.: 14/011,684

(22) Filed: Aug. 27, 2013

(65) Prior Publication Data

US 2014/0060146 A1 Mar. 6, 2014

(30) Foreign Application Priority Data

Aug. 28, 2012 (DE) .......................... 10 2012 215 239

(51) Int. Cl.
*G01L 25/00* (2006.01)
*G01L 27/00* (2006.01)
*H04R 29/00* (2006.01)

(52) U.S. Cl.
CPC ............ *G01L 25/00* (2013.01); *G01L 27/005* (2013.01); *H04R 29/004* (2013.01); *H04R 2201/003* (2013.01)

(58) Field of Classification Search
CPC ....................................................... G01L 25/00

(Continued)

(56) References Cited

U.S. PATENT DOCUMENTS 4,607,186 A * 8/1986 Takayama et al. ............ 310/324
4,924,131 A * 5/1990 Nakayama et al. .......... 310/329

(Continued)

FOREIGN PATENT DOCUMENTS

DE 101 54 867 5/2003

OTHER PUBLICATIONS

Hong, Eunki, et al. "Micromachined piezoelectric diaphragms actuated by ring shaped interdigitated transducer electrodes." Sensors and Actuators A: Physical 119.2 (2005): 521-527.*

*Primary Examiner* — Michael A Lyons
*Assistant Examiner* — Alexander Mercado
(74) *Attorney, Agent, or Firm* — Gerard Messina

(57) ABSTRACT

Measures are described which simplify the functional testing of a component having an MEMS element provided with a pressure-sensitive sensor diaphragm, and which allow a self-calibration of the component even after it is already in place, i.e., following the end of the production process. The component has a housing, in which are situated at least one MEMS element having a pressure-sensitive sensor diaphragm and a switching arrangement for detecting the diaphragm deflections as measuring signals; an arrangement for analyzing the measuring signals; and an arrangement for the defined excitation of the sensor diaphragm. The housing has at least one pressure connection port. The arrangement for exciting the sensor diaphragm includes at least one selectively actuable actuator component for generating defined pressure pulses that act on the sensor diaphragm.

12 Claims, 4 Drawing Sheets

(58) Field of Classification Search
    USPC .......................................... 73/1.15, 862.473
    See application file for complete search history.

(56) References Cited

U.S. PATENT DOCUMENTS

| | | | |
|---|---|---|---|
| 7,885,423 B2* | 2/2011 | Weigold .................. | 381/174 |
| 2002/0094095 A1* | 7/2002 | Ellis et al. .................. | 381/152 |
| 2003/0173873 A1* | 9/2003 | Bryant et al. ................ | 310/365 |
| 2006/0136544 A1* | 6/2006 | Atsmon et al. .............. | 709/200 |
| 2007/0095146 A1* | 5/2007 | Brosh ......................... | 73/722 |
| 2007/0103697 A1* | 5/2007 | Degertekin ................. | 356/501 |
| 2008/0075306 A1* | 3/2008 | Poulsen et al. .............. | 381/111 |
| 2009/0003613 A1* | 1/2009 | Christensen ................. | 381/58 |
| 2009/0031818 A1* | 2/2009 | McKinnell et al. .......... | 73/727 |
| 2009/0115430 A1* | 5/2009 | Fang et al. ................... | 324/686 |
| 2010/0272270 A1* | 10/2010 | Chaikin et al. .............. | 381/59 |
| 2011/0154905 A1* | 6/2011 | Hsu et al. .................... | 73/724 |
| 2012/0017693 A1* | 1/2012 | Robert et al. ................ | 73/753 |
| 2013/0001550 A1* | 1/2013 | Seeger et al. ................ | 257/48 |
| 2013/0160554 A1* | 6/2013 | Chen et al. .................. | 73/632 |
| 2013/0255393 A1* | 10/2013 | Fukuzawa et al. ........... | 73/779 |
| 2013/0277776 A1* | 10/2013 | Herzum et al. .............. | 257/416 |
| 2014/0053651 A1* | 2/2014 | Besling et al. ............... | 73/702 |
| 2014/0060146 A1* | 3/2014 | Zoellin et al. ............... | 73/1.15 |
| 2014/0076052 A1* | 3/2014 | Doller et al. ................. | 73/587 |
| 2014/0083201 A1* | 3/2014 | Lanier et al. ................ | 73/861.18 |
| 2014/0250969 A1* | 9/2014 | Alagarsamy et al. ........ | 73/1.01 |
| 2015/0010157 A1* | 1/2015 | Doller .......................... | 381/58 |
| 2015/0104048 A1* | 4/2015 | Uchida et al. ............... | 381/174 |

* cited by examiner

COMPONENT PART AND METHOD FOR TESTING SUCH A COMPONENT PART

FIELD OF THE INVENTION

The present invention relates to a component part having a housing, in which at least one MEMS element having a pressure-sensitive sensor diaphragm and a switching arrangement for detecting the diaphragm deflections as measuring signals is situated, as well as means for analyzing the measuring signals, and an arrangement for the defined excitation of the sensor diaphragm. The housing of the component part is provided with at least one pressure-port opening.

In addition, the present invention relates to a method for testing such a component part. The component part preferably is a microphone element or also a pressure sensor component.

BACKGROUND INFORMATION

As a rule, such microphone elements are subjected to a final acoustics measurement at the end of production, during which compliance with specifications is checked, e.g., the sensitivity, noise, frequency response characteristic and current consumption. A test for the correct functioning of the individual components parts, especially the MEMS and ASIC elements at the wafer level, which is relatively cost-effective, is insufficient in this case since the microphone packaging, i.e., the physical layout and connection technology and the component housing, has an important influence on the microphone performance. The testing costs represent a significant portion of the total cost of the component part.

German Published Patent Application No. 101 54 867 describes one possibility for testing the sensor properties of a micromechanical pressure sensor element. This pressure sensor element includes a sensor diaphragm, which spans a sealed cavity in the semiconductor substrate of the structural element. An electrode, which forms a capacitor together with an electrode on the diaphragm, is situated on the cavity bottom. This capacitor is used not only for the capacitive signal acquisition, but also the selective excitation of the diaphragm. To do so, a defined, i.e., temporally varying, voltage is applied to the capacitor in order to induce vibrations in the sensor diaphragm. The resulting diaphragm deflections are then recorded in terms of quantity and quality with the aid of the capacitor. When the measuring signals obtained in this manner are analyzed, it is possible to draw conclusions regarding the height and extension of the cavity, as well as the mobility and thickness of the diaphragm, its maximum deflectability and its elastic modulus.

SUMMARY

The present invention provides measures that simplify the functional testing of a component part of the type discussed here; they additionally allow a self-calibration of the component part even after it is already in place, i.e., after completion of the production process.

According to the present invention, the component part is provided with at least one selectively actuable actuator component for generating defined pressure pulses that act on the sensor diaphragm.

The operativeness of such an actuator component is able to be checked at the wafer level, in the same way as the operativeness of the other components of the component part. The expense this entails is relatively low. With the aid of the actuator component, the final testing of the component part, during which the influence of the packaging then comes to bear as well, is able to be performed separately for each component part. Since this final testing does not require a special testing environment, the related expense remains reasonable, so that the overall testing costs for the component part according to the present invention are relatively low.

In addition, the measures of the present invention allow a functional test under authentic testing conditions, which contributes to the meaningfulness of the test results. For the sensor diaphragm is not actively deflected in such a case, but incited using a test signal that corresponds to the type of measured quantity and which also ranges within the framework of the expected signal level. The actuator component generates a corresponding pressure signal for this purpose, which impinges on the sensor diaphragm in the manner of a measuring pressure or a sound wave. The diaphragm deflections that come about as a result are acquired in the way of measuring signals. Only the analysis of the signals acquired in testing mode differs from the analysis of the measured signals acquired in standard operation.

The component part according to the present invention is characterized by low fault susceptibility, because the functions of the individual component parts are clearly separated from each other. For example, the sensor component is used exclusively for the acquisition of signals. The actuator component is actuated exclusively in test mode, to apply a defined pressure signal to the sensor diaphragm. Only the analysis of the measuring signals depends on the operating mode of the component part.

In general, there are different possibilities for realizing a component part according to the present invention, in particular as far as the actuator component of the component part is concerned.

In order to decouple the individual component parts not only with regard to function, but also from the aspect of their manufacture, the actuator component may be implemented in a stand-alone component installed inside the component housing, independently of the MEMS component having the sensor diaphragm. This could be an additional MEMS element. However, a different technology may be used to realize the actuator component. In an advantageous manner, the arrangement for actuating the actuator component and the arrangement for analyzing the measured signals of the sensor component are situated on a shared ASIC element, because these processes are executed in coordinated manner, as previously elucidated.

In one preferred specific embodiment of the present invention, the actuator component is at least partially integrated into the structural element configuration of the MEMS element. In this case, the pressure pulses are generated with the aid of a micromechanical structure, which is able to be actuated independently of the sensor structure of the MEMS element.

In this specific embodiment, the actuator structure and the type of sensor structure are advantageously adapted to one another. For one, this makes it possible to optimize the layout of the MEMS element and for another, the actuator structure and sensor structure are then able to be produced jointly in the layer structure of the MEMS element, in a single production process. Therefore, the actuator component advantageously includes at least one actuator diaphragm which is developed on the side, next to the sensor diaphragm. In addition, a switching arrangement is provided to allow the actuator diaphragm to be actuated and deflected independently of the sensor diaphragm. This makes it possible to selectively generate defined pressure pulses that act on the sensor diaphragm. The switching arrangement, for example, may be piezoelectric layers featuring selective actuation, which preferably are disposed in the edge region of the actuator diaphragm. In this way it is possible to cause relatively large deflections of the actuator diaphragm, and thus to also generate relatively large pressure pulses.

However, the actuator diaphragm may also be actuated in capacitive manner. This variant is especially suitable for capacitive microphone elements having a microphone diaphragm and a stationary counter element, on which the electrodes of a microphone capacitor are situated. In this case, the actuator diaphragm, too, is provided with at least one electrode, which forms a selectively actuable actuator capacitor in combination with at least one electrode on the stationary counter element.

In view of a uniform excitation of the sensor diaphragm, it is advantageous if the actuator diaphragm is developed in the form of a ring and placed concentrically with respect to the sensor diaphragm.

As already mentioned, the actuator component of the component part of the present invention is used for generating defined pressure pulses inside the component housing in order to thereby deflect the sensor diaphragm or to excite it to vibrations for testing purposes. Toward this end, for example, the diaphragm of the actuator component may be selectively deflected as far as a stop in the actuator structure. Since the actuator travel is defined in such a case, the resulting pressure pulse is defined as well. A corresponding analysis of the measuring signal obtained in this manner allows the functional properties of the component part to be evaluated. Components may thus be declared to be in good order or to be defective at the end of the production process, so that defective parts may be identified and discarded. The analysis of the measuring signals caused by the defined pressure pulses also allows a calibration of the component, in which the electrical sensor parameters, especially the polarization voltage and the mechanical prestressing of the sensor diaphragm, are adapted as a function of the result of the analysis in order to obtain the desired sensor specification.

Since the actuator component is an element of the component part, the sensor characteristics of the component part are thus able to be checked and adjusted again and again across its entire service life, so that drift of the sensor properties is counteracted. Such a function check with a subsequent adaptation of the electrical sensor parameters may be initiated automatically, i.e., at regular time intervals, for instance, or otherwise also be activated from the outside.

DETAILED DESCRIPTION

Figure 1:
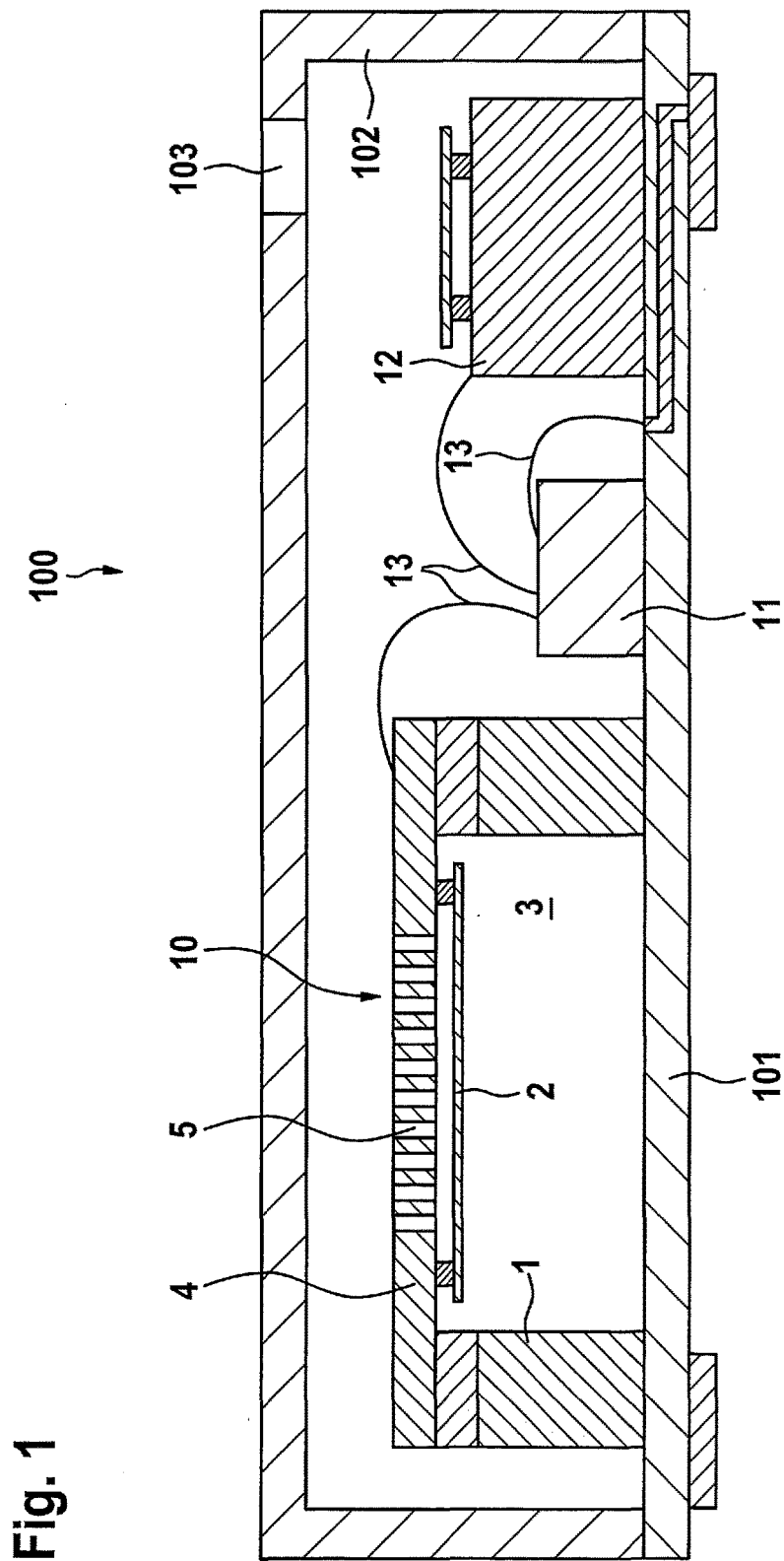
FIG. 1 shows a schematic sectional view through a microphone element 100 according to the present invention.

Component part 100 shown in FIG. 1 is a microphone component part having an MEMS microphone element 10. The microphone structure is realized in a layer construction on a semiconductor substrate 1 and includes a microphone diaphragm 2, which spans a cavity 3 in the rear side of the substrate. A stationary counter element 4 provided with through holes 5 is situated in the layer construction above microphone diaphragm 2. Microphone element 10 is mounted on a support 101 via the substrate rear side, so that support 101 seals cavity 3 underneath microphone diaphragm 2 in pressure-tight manner. Support 101 forms the housing of component part 100, together with a cover part 102. A pressure connection port 103 is situated in cover part 102. Sound is applied to microphone diaphragm 2 via this pressure connection port 103 in the component housing, and via through holes 5 in counter element 4 of microphone element 10. Sealed cavity 3 is used as rear volume. The deflections of microphone diaphragm 2 are detected in capacitive manner. Toward this end, microphone diaphragm 2 and counter element 4 each have at least one electrode which jointly form a microphone capacitor. The microphone signal obtained in this manner is analyzed with the aid of an ASIC element 11, which is situated next to microphone element 10 on support 101 inside the component housing.

According to the present invention, component part 100 furthermore includes a selectively actuable actuator component 12, which may be used to generate defined pressure pulses inside the housing. These pressure pulses act on microphone diaphragm 2 and excite it to vibrations, which are detected with the aid of the microphone capacitor and analyzed with the aid of ASIC element 11.

In the exemplary embodiment shown here, actuator component 12 is realized in the form of a stand-alone element 12, which is likewise installed on support 101 inside the component housing. Like microphone element 10, actuator element 12 is electrically connected to ASIC element 11 via bond wires 13 as well. The ASIC element in this case coordinates the activation of actuator component 12 and the analysis of the measuring signals detected by the microphone capacitor in test mode.

Bond wires 13 also connect ASIC element 11 to support 101, by way of which the external contacting takes place in the second-level installation of component 100.

Figure 2:
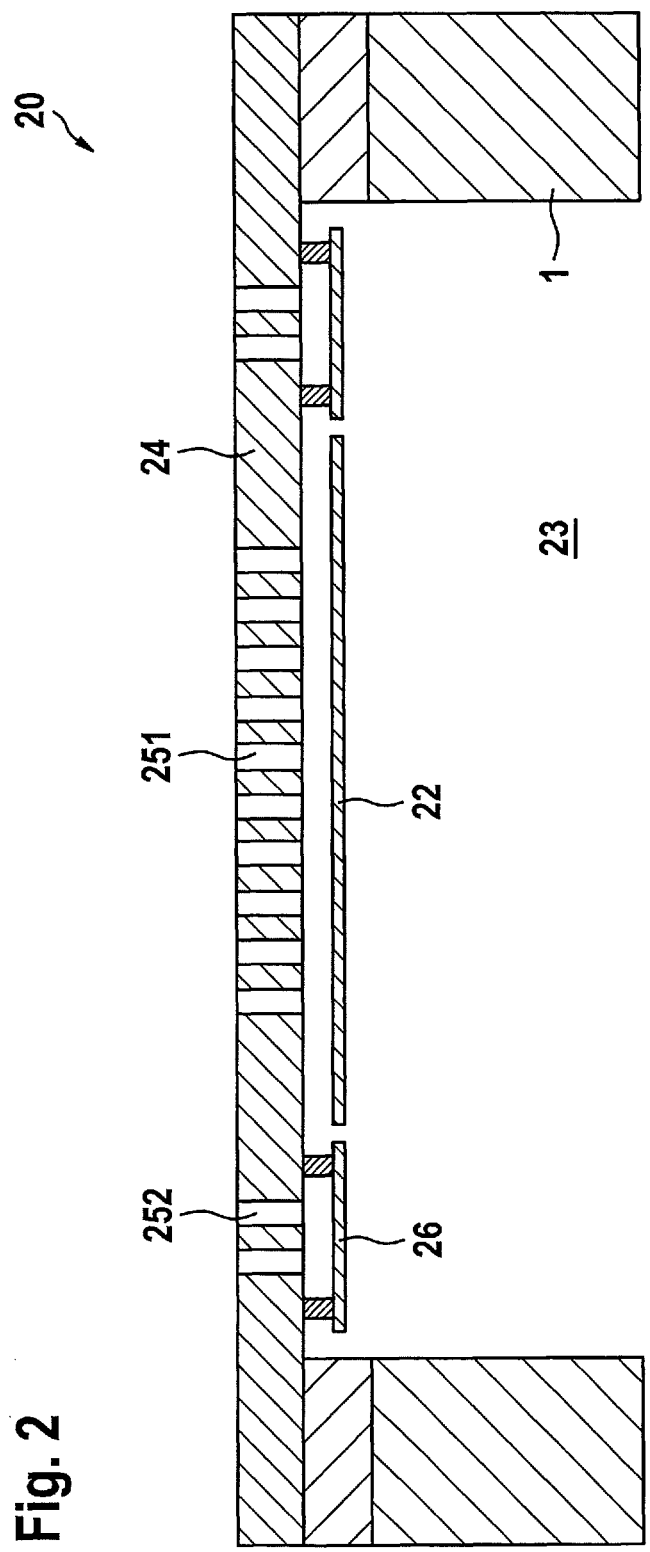
FIG. 2 shows a schematic sectional view through MEMS element 20 of a component part according to the present invention.

FIG. 2 shows an MEMS element 20, which is specifically configured for use in a component part according to the present invention. Here, too, this is a microphone element 20 having a microphone diaphragm 22 and a stationary counter element 24, each being equipped with at least one electrode of a microphone capacitor. Microphone diaphragm 22 and counter element 24 are realized in a layer configuration on a semiconductor substrate 1, so that microphone diaphragm 22 spans a cavity 23 in the rear side of the substrate. Counter element 24 is situated above microphone diaphragm 22 in the layer construction and has through holes 251 above the diaphragm region.

In addition to this microphone structure, MEMS element 20 includes an actuator structure by which the microphone diaphragm is able to be selectively incited for the function test of the component part. This actuator structure includes a ring diaphragm 26, which is disposed concentrically to microphone diaphragm 22 and formed in the same layer of the layer construction. Through holes 252 in stationary counter element 24 are formed above ring diaphragm 26 as well. Like microphone diaphragm 22 and the opposite-lying region of counter element 24, ring diaphragm 26 and the region of counter element 24 lying opposite it are provided with at least one electrode of a capacitor system in each case. In contrast to the microphone capacitor, which is used for signal acquisition, the capacitor system in the region of ring diaphragm 26 is used for the selective actuation of ring diaphragm 26, i.e., for the generation of defined pressure pulses that act on microphone diaphragm 22. The vibrations of microphone diaphragm 22 induced in this manner are detected with the aid of the microphone capacitor and may then be analyzed in the sense of a function test of the component part.

Microphone element 20 shown in FIG. 2 may be installed on the element support of a component housing, just like microphone element 20 shown in FIG. 2, so that rear-side cavity 23 as rear side volume is sealed in pressure-tight manner. Because of the concentric placement of microphone diaphragm 22 and actuator ring diaphragm 26 above rear-side cavity 23, microphone element 20 has a greater rear-side volume than microphone element 10 shown in FIG. 1, which has a positive effect on the microphone properties of a component part realized in this manner.

Figure 3A:
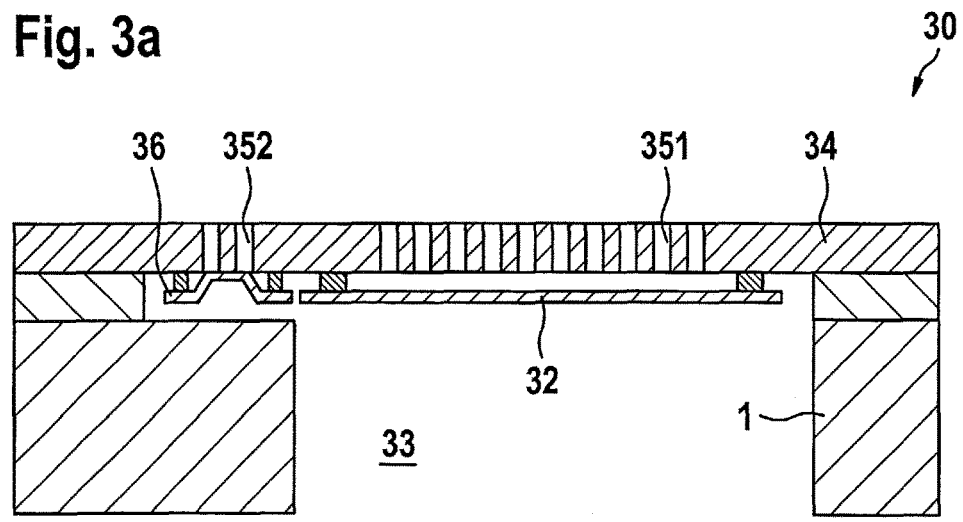
FIG. 3a, b show schematic sectional views through MEMS element 30 of a component part according to the present invention, with an activated actuator component.
Figure 3B:
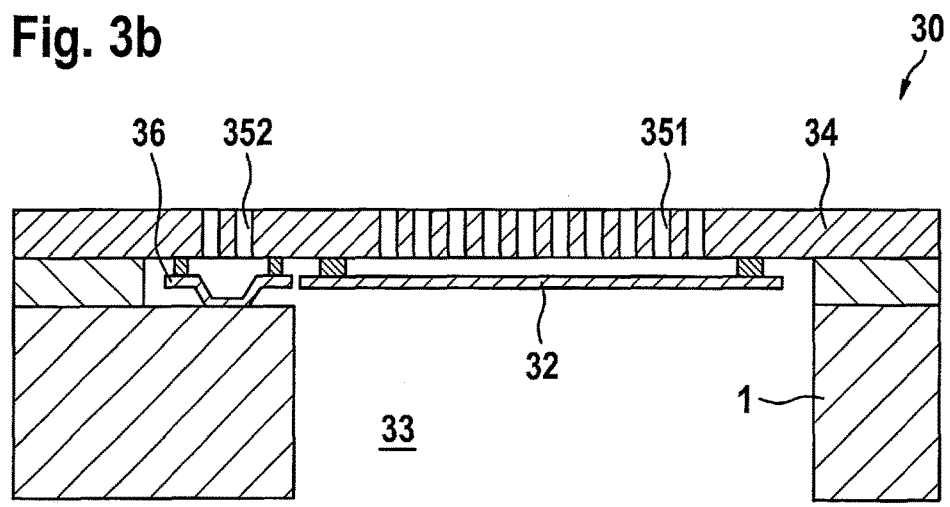

MEMS microphone element 20 shown in FIGS. 3a and 3b, is also configured specifically for use in a component part according to the present invention and, in addition to the capacitive microphone structure, has been provided with an actuator structure which is actuable in capacitive manner. As in the case of microphone element 20, both the microphone structure and the actuator structure are realized in a layer construction on a semiconductor substrate 1. The microphone structure includes a microphone diaphragm 32 and a stationary counter element 34 having through holes 351 in the region above microphone diaphragm 32. The actuator structure also includes a diaphragm 36, which in this case is disposed on the side next to microphone diaphragm 32 and formed in the same layer of the layer construction. Through holes 352 in stationary counter element 34 are situated in the region above this actuator diaphragm 36. Like microphone diaphragm 32 and the region of counter element 34 lying opposite it, actuator diaphragm 36 and the opposite-lying region of counter element 34 are each provided with at least one electrode of a capacitor system. The microphone capacitor is used for signal detection, while the capacitor system in the region of actuator diaphragm 36 is used for the selective actuation of actuator diaphragm 36.

In contrast to microphone element 20, only microphone diaphragm 32 extends above cavity 33 in the rear side of the substrate in this particular case. Actuator diaphragm 36 is situated along the side thereof and exposed only within the layer construction on substrate 1. Another stationary electrode of the capacitor system of the actuator construction is situated on substrate 1, underneath actuator diaphragm 36. This electrode may be realized in the form of suitable substrate doping or also in the form of conductive coating that is electrically insulated with respect to the substrate. FIGS. 3a and 3b illustrate that actuator diaphragm 36 is selectively deflectable with the aid of this capacitor system, both in the direction of counter element 34 and in the direction of substrate 1. Because of the greater diaphragm excursion of actuator diaphragm 36 in comparison to microphone element 20, it is therefore possible to generate greater pressure pulses for the excitation of microphone diaphragm 32.

Like microphone element 10 shown in FIG. 1, microphone element 30 is preferably installed on the component support of a component housing, so that rear-side cavity 33 as rear-side volume is sealed in pressure-tight manner.

In this context it should be noted once again that it is not absolutely necessary to provide a separate ASIC element for the arrangement for signal analysis and actuation of the actuator component. A corresponding switching arrangement could also be integrated into the MEMS element of the component part of the present invention.

Figure 4:
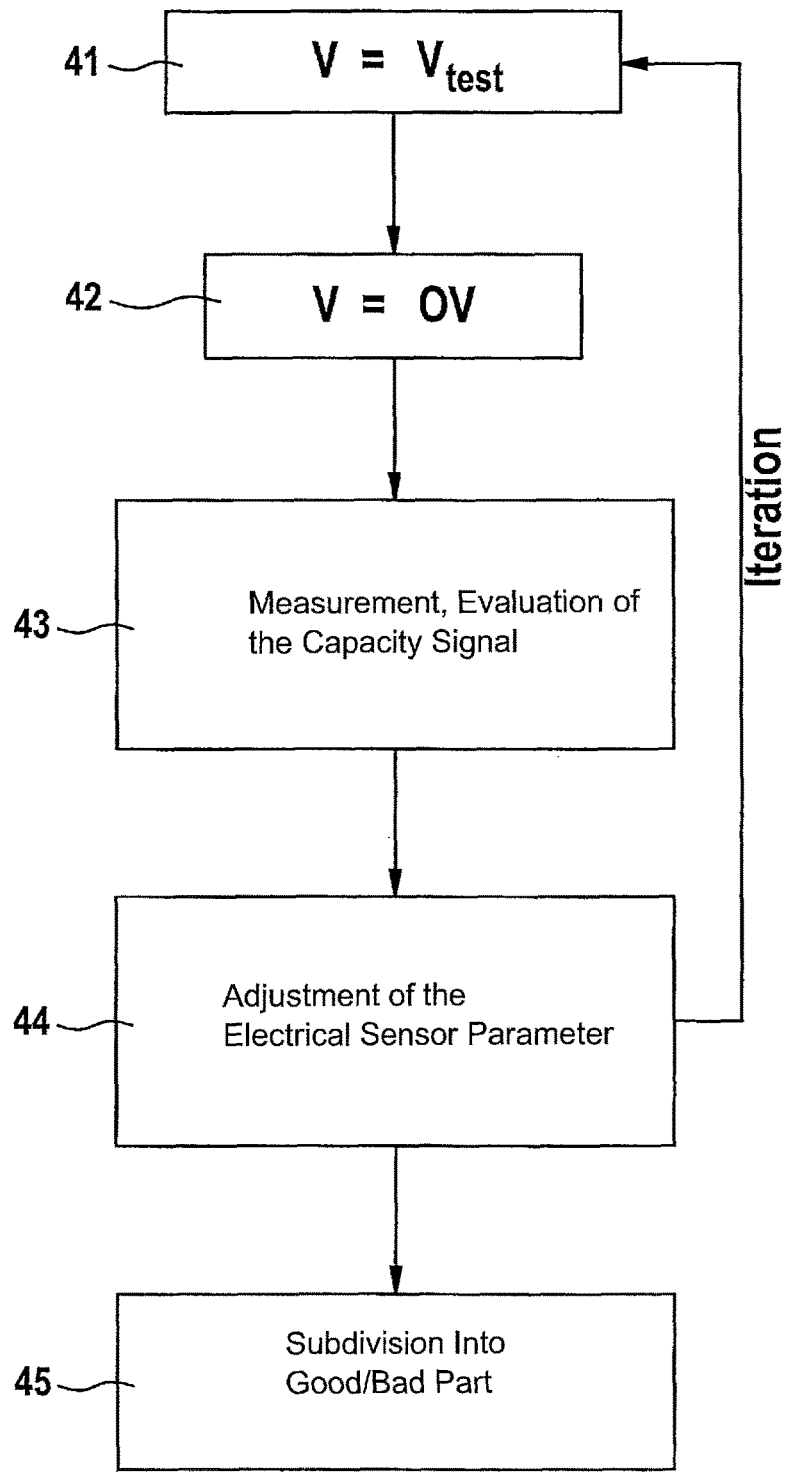
FIG. 4 shows a flow chart of the method of the present invention for testing a component part of the type under discussion.

The method according to the present invention for the purely electrical testing, characterization and adaptation of the sensor properties of a microphone component part having a microphone element as illustrated in FIGS. 2 and 3 will be explained in the following text with reference to FIG. 4. The component part is operated in test mode for this functional test. In a first step 41, the capacitor system of the actuator component is actuated by applying a defined test voltage $V_{test}$. This causes a defined deflection of the actuator diaphragm. In the next step 42, the test voltage is switched off, so that the actuator diaphragm is released and vibrates. The pressure pulses induced in this manner impinge upon the microphone diaphragm and excite it to vibrations as well. These deflections of the microphone diaphragm are detected in step 43 with the aid of the microphone capacitor and analyzed according to the test mode. Since the measuring signal obtained in this manner contains all the information of the acoustic properties of the housed microphone element, it will then be possible in step 44 to adapt the electrical sensor parameters appropriately, such as the polarization voltage and the mechanical diaphragm prestressing, for instance. The test process may then be repeated in order to ascertain whether the performed adaptations of the sensor parameters have had the desired effect on the acoustic properties of the microphone element. In a final method step 45, the component is classified either as good part or as reject part, depending on the determined acoustic characteristics.

What is claimed is:

1. A component, comprising:
    a housing in which are situated at least:
        an MEMS element having a pressure-sensitive sensor diaphragm and a switching arrangement for detecting a diaphragm deflection as a measuring signal,
        an arrangement for analyzing the measuring signal,
        an arrangement for providing a defined excitation of the sensor diaphragm, and
        at least one pressure connection port, wherein the arrangement for exciting the sensor diaphragm includes at least one selectively actuable actuator component for generating defined pressure pulses that act on the sensor diaphragm, and wherein:
            the at least one pressure connection port is a through hole in the housing,
            the actuator component is at least partially integrated into a component structure of the MEMS element;
            the actuator component includes at least:
                an actuator diaphragm formed on a side next to the sensor diaphragm, and
                a switching arrangement for deflecting the actuator diaphragm independently of the sensor diaphragm, wherein the actuator diaphragm is provided with at least one electrode of a selectively actuable actuator capacitor;
            at least one stationary counter element is developed at least one of above and below the actuator diaphragm in the component structure of the MEMS element; and
            the counter element is provided with at least one counter electrode of the actuator capacitor.

2. The component as recited in claim 1, wherein the actuator diaphragm is provided with selectively actuable piezo layers.

3. The component as recited in claim 1, wherein the actuator diaphragm is a ring situated concentrically to the sensor diaphragm.

4. The component as recited in claim 1, wherein the actuator component is realized independently of the first MEMS element having the sensor diaphragm, in a further structural element.

5. The component as recited in claim 4, wherein the further structural element includes a further MEMS element.

6. The component as recited in claim 1, wherein the component is included in a pressure sensor component.

7. The component as recited in claim 1, wherein the component is included in a microphone element.

8. A method for testing a component having a housing, in which are situated at least one pressure connection port, at least an MEMS element having a pressure-sensitive sensor diaphragm and a switching arrangement for detecting a diaphragm deflection, and an arrangement for analyzing the diaphragm deflection, the method comprising:
generating at least one defined pressure pulse inside the housing with the aid of an actuator component;
detecting and analyzing deflections of the sensor diaphragm induced by the defined pressure pulse inside the housing with the aid of the arrangement for analyzing the diaphragm deflection; and wherein:
the at least one pressure connection port is a through hole in the housing;
the actuator component is at least partially integrated into a component structure of the MEMS element;
the actuator component includes at least:
an actuator diaphragm formed on a side next to the sensor diaphragm, and
a switching arrangement for deflecting the actuator diaphragm independently of the sensor diaphragm, wherein the actuator diaphragm is provided with at least one electrode of a selectively actuable actuator capacitor;
at least one stationary counter element is developed at least one of above and below the actuator diaphragm in the component structure of the MEMS element; and
the counter element is provided with at least one counter electrode of the actuator capacitor.

9. The method as recited in claim 8, wherein the method is for calibrating the component.

10. The method as recited in claim 8, further comprising:
adapting an electrical sensor parameter of the component as a function of a result of the analysis.

11. The method as recited in claim 10, wherein the electrical sensor parameter includes one of a polarization voltage and a mechanical prestressing of the sensor diaphragm.

12. The method as recited in claim 8, wherein the component is declared a good part or a defective part as a function of a result of the analysis.

* * * * *